United States Patent [19]

Otsuka

[11] Patent Number: 5,438,952
[45] Date of Patent: Aug. 8, 1995

[54] METHOD OF GROWING A SEMICONDUCTOR LAYER AND A FABRICATION METHOD OF A SEMICONDUCTOR DEVICE USING SUCH A SEMICONDUCTOR LAYER

[75] Inventor: Nobuyuki Otsuka, Kawasaki, Japan

[73] Assignee: Fujitsu Limited, Kawasaki, Japan

[21] Appl. No.: 189,147

[22] Filed: Jan. 31, 1994

[30] Foreign Application Priority Data

Mar. 24, 1993 [JP] Japan .................. 5-065634

[51] Int. Cl.⁶ .................................. C30B 25/02
[52] U.S. Cl. .................. 117/84; 117/104; 117/954
[58] Field of Search ............... 117/89, 99, 104, 953, 117/954, 955

[56] References Cited

U.S. PATENT DOCUMENTS

| | | | |
|---|---|---|---|
| 4,464,233 | 8/1984 | Mullin et al. | 204/59 |
| 5,082,798 | 1/1992 | Arimoto | 117/89 |
| 5,225,561 | 7/1993 | Kirlin et al. | 546/256 |
| 5,332,451 | 7/1994 | Hata et al. | 148/33.2 |

*Primary Examiner*—R. Bruce Breneman
*Assistant Examiner*—Felisa Garrett
*Attorney, Agent, or Firm*—Armstrong, Westerman, Hattori, McLeland & Naughton

[57] ABSTRACT

A method of fabricating a compound semiconductor device includes the steps of supplying an amine-adduct of a compound that contains a constituent element of a crystal layer that forms the semiconductor device, to a substrate on which the semiconductor device is formed, as a source material of the crystal layer, decomposing the amine-adduct in the vicinity of the substrate such that the constituent element is released, and depositing the constituent element on the substrate to cause a growth of the crystal layer on the substrate.

17 Claims, 8 Drawing Sheets

METHOD OF GROWING A SEMICONDUCTOR LAYER AND A FABRICATION METHOD OF A SEMICONDUCTOR DEVICE USING SUCH A SEMICONDUCTOR LAYER

BACKGROUND OF THE INVENTION

The present invention generally relates to fabrication of semiconductor devices and more particularly to a method for growing a mixed crystal layer of a compound semiconductor material.

In the effort of developing high performance semiconductor devices, one encounters a persistent demand for a high quality semiconductor crystal. Particularly, there is a keen demand for a high quality crystal of compound semiconductor materials. The compound semiconductor materials generally have a band structure that provides a high electron mobility, and many of them show a direct transition of carriers that facilitates the absorption and emission of light. Thus, compound semiconductor devices are used for high performance semiconductor devices such as optical semiconductor devices including laser diodes and light emitting diodes, high speed semiconductor devices including HEMTs (high-electron-mobility transistors) or RHETs (resonant-tunneling hot-electron transistors) as well as quantum semiconductor devices that confine the carriers in a limited region such that a quantum mechanical effect of carriers becomes appreciable. As the compound semiconductor materials generally form a mixed crystal over a wide compositional range, one can construct various quantum structures that facilitates the quantum mechanical effect.

Generally, a compound semiconductor crystal is grown on a substrate crystal in the form of an epitaxial layer. In order to grow such an epitaxial layer, various processes are known, wherein so-called MBE (molecular beam epitaxy) and MOCVD (metal-organic chemical vapor deposition) processes are used extensively. In any of these processes, atoms of the elements that constitute the compound semiconductor material are supplied simultaneously to the surface of a substrate for deposition. For example, atoms of the group III elements such as Al or Ga and atoms of the group V elements such as As are supplied simultaneously to the surface of the substrate, wherein the atoms thus supplied are incorporated into respective crystallographic sites of the crystal layer on the substrate. In such a process, it is generally impossible to eliminate defects wherein a group III element such as Ga is incorporated into the site of a group V element such as As. While there are proposals to utilize such defects positively, various efforts are being made to eliminate the formation of such defects by depositing a layer of Ga atoms and a layer of As atoms alternately, one layer by one layer.

The atomic layer epitaxy (ALE) is a process that realizes such a monoatomic layer growth. The process relies upon a self-limiting effect that appears when a gaseous source material is supplied on an epitaxial layer, wherein the crystal growth stops substantially upon a growth of a monoatomic layer. For example, a source gas containing Ga is supplied on a substrate for depositing Ga thereon. Upon growth of a Ga monoatomic layer, the supply of the Ga source gas is interrupted and the reaction vessel in which the growth has been made is flushed. Further, another source gas containing As is supplied and a monoatomic layer of As is grown on the monoatomic layer of Ga grown previously. By repeating the foregoing steps, one can obtain a crystal layer substantially free from defects. When a GaAs layer is grown, trimethylgallium [$(CH_3)_3Ga$; TMG] is used for the source of Ga and arsine ($AsH_3$) is used for the source of As. Upon supplying, the source gases cause a pyrolytic decomposition at the surface of the substrate and atoms of Ga and As are released as a result. Because of the foregoing self-limiting effect, the Ga and As atoms thus released form only a monoatomic layer in each of the steps. Such an art of atomic layer epitaxy is described in the U.S. Pat. No. 4,058,430, which is incorporated herein as reference. A similar atomic layer epitaxy is reported also for material systems other than GaAs such as InAs. When growing an epitaxial layer of InAs by the atomic layer epitaxy, trimethylindium [$(CH_3)_3In$; TMI] is used as the source of In.

In the atomic layer epitaxy, it will be easily understood that there exists an optimum condition, particularly an optimum temperature, for realizing the foregoing self-limiting effect. When the optimum temperature range has been exceeded, the desired monoatomic layer growth no longer holds. As the optimum temperature range for the atomic layer epitaxy changes depending upon the material system used for growing the crystal, there has been a difficulty for growing a layer of mixed crystal by the atomic layer epitaxy. For example, the optimum temperature for growing a GaAs layer by the atomic layer epitaxy of TMG and arsine is about 500° C. On the other hand, the optimum temperature for growing an InAs layer by the atomic layer epitaxy of TMI and arsine is about 350° C. In such a case, the monoatomic layer growth of In does not occur when the growth of the mixed crystal is made at a temperature of 500° C. Instead of the monoatomic layer growth, a thick layer of InAs is formed by a single growth step. When the temperature of growth is set to 350° C., on the other hand, the growth rate of the GaAs layer decreases substantially, resulting no substantial growth of the crystal layer. Because of such a difference in the optimum temperature of crystal growth, it has been difficult to provide the growth of mixed crystals according to the conventional atomic layer epitaxy. While it is possible to achieve the growth of a GaAs layer at a temperature of 350° C. when triethylgallium [$(C_2H_5)_3Ga$; TEG] is used, this material does not show a clear self-limiting effect and the desired monoatomic layer growth is not obtained even when combined with the atomic layer epitaxy process that uses TMI and arsine.

Meanwhile, it has been known that the appearance of an ordered structure of In and Ga in an InGaAs layer results in a decrease of alloy scattering of carriers and a corresponding increase of the carrier mobility (Nakata et al., J. Crystal Growth 115, 1991, pp. 504–508). By using such an ordered InGaAs layer in combination with an n-type InAlAs layer, it is expected that an electron mobility that reaches as much as 161,000 $cm^2/V.s$ is obtained for the two-dimensional electron gas formed at the heterojunction interface of the InGaAs layer and the InAlAs layer. Usually, such an ordered structure appears as a result of the thermodynamic equilibrium in the crystal and controlled by the temperature at which the crystal growth is made. Thus, a complete ordering of In and Ga is achieved only when the crystal growth is made at an extremely low temperature. However, the crystal growth at such an extremely low temperature is of course impossible.

By using the atomic layer epitaxy, one can obtain a completely ordered crystal artificially and without relying upon the thermodynamic equilibrium, by growing the crystal one atomic layer by one atomic layer. Such an artificially ordered structure forms an artificial superlattice structure. As the alloy scattering of the carriers is entirely eliminated in such an artificially ordered structure, it is expected that such a structure provides an electron mobility that reaches the order of $10^6$ cm$^2$/V.s. As already noted, however, because of the difficulty in growing mixed crystals by the atomic layer epitaxy, the growth of crystal layers having such an artificial superlattice structure has been unsuccessful.

SUMMARY OF THE INVENTION

Accordingly, it is a general object of the present invention to provide a novel and useful method of growing a semiconductor layer and a fabrication method of a semiconductor device that uses the semiconductor layer thus grown, wherein the foregoing problems are eliminated.

Another object of the present invention is to provide a method of growing a semiconductor crystal layer and a fabrication method of a semiconductor device, comprising the steps of:

supplying an amine-adduct of a compound that contains a constituent element of a semiconductor crystal layer to be grown on a substrate, into a reaction vessel in which a growth of said semiconductor crystal layer occurs, as a source material;

decomposing said amine-adduct of said compound in said reaction vessel in the vicinity of said substrate so as to release said element contained in said amine-adduct; and depositing said element released by said step of decomposing, on said substrate to cause a growth of said semiconductor crystal layer on said substrate.

According to the present invention, one can increase the chemical stability of the compound that is used for the source material, by using the amine-adduct of the compound rather than the compound itself. By using the amine-adduct, the decomposition temperature of the source material increases as compared with the case wherein the compound itself is used for the source material. As a result, the desired monoatomic layer growth is possible even at elevated temperatures at which the atomic layer epitaxy has hitherto been impossible. Thereby, the optimum temperature range for the atomic layer epitaxy is substantially expanded, and such an expanded optimum temperature range in turn enables the crystal growth of various mixed crystals by the atomic layer epitaxy. As a result of the crystal growth of the mixed crystals by means of the atomic layer epitaxy, one obtains an artificial superlattice structure having more or less completely ordered structure for the compound semiconductor layer grown on a substrate. Because of the high degree of ordering, such a compound semiconductor layer causes little alloy scattering of carriers and a very large electron mobility can be realized. Further, such an artificial superlattice structure can minimize the distortion of crystal lattice, when grown on a substrate, as compared with the structure wherein atoms of different atomic radii are distributed at random. Thus, one can change the composition of the semiconductor layer grown on the substrate over a wide compositional range, while maintaining an excellent lattice matching and without inviting substantial formation of defects. By using such a feature, one can construct a laser diode in which the oscillation wavelength can be selected from a wide range of wavelengths.

It should be noted that the amine-adducts of alkyl compounds do not cause spontaneous ignition when contacted with air, contrary to other, usual organic sources of MOCVD or ALE such as TEG or TMI. In other words, the amine-adducts are easy to handle in the fabrication process of semiconductor devices. This feature is particularly advantageous when mass-producing semiconductor devices. Another remarkable feature of using amine-adducts is that the amine-adduct of alane (AlH$_3$), represented as AlH$_3$.NR$_3$, reacts little with TMG, TEG or TMI and thus can be supplied into the reaction vessel together and simultaneously with these source materials of Ga or In. Thus, this feature is useful for improving the efficiency of conventional MBE or MOCVD process.

Other objects and further features of the present invention will become apparent from the following detailed description of the preferred embodiments when read in conjunction with the attached drawings.

DETAILED DESCRIPTION OF THE PREFERRED EMBODIMENT

Hereinafter, the present invention will be described with reference to preferred embodiments. Although the description below is given primarily with reference to the atomic layer epitaxy of an InGaAs layer, the present invention is by no means limited to such a particular material system.

First, the apparatus used for growing the crystal layer will be described briefly.

Figure 1:
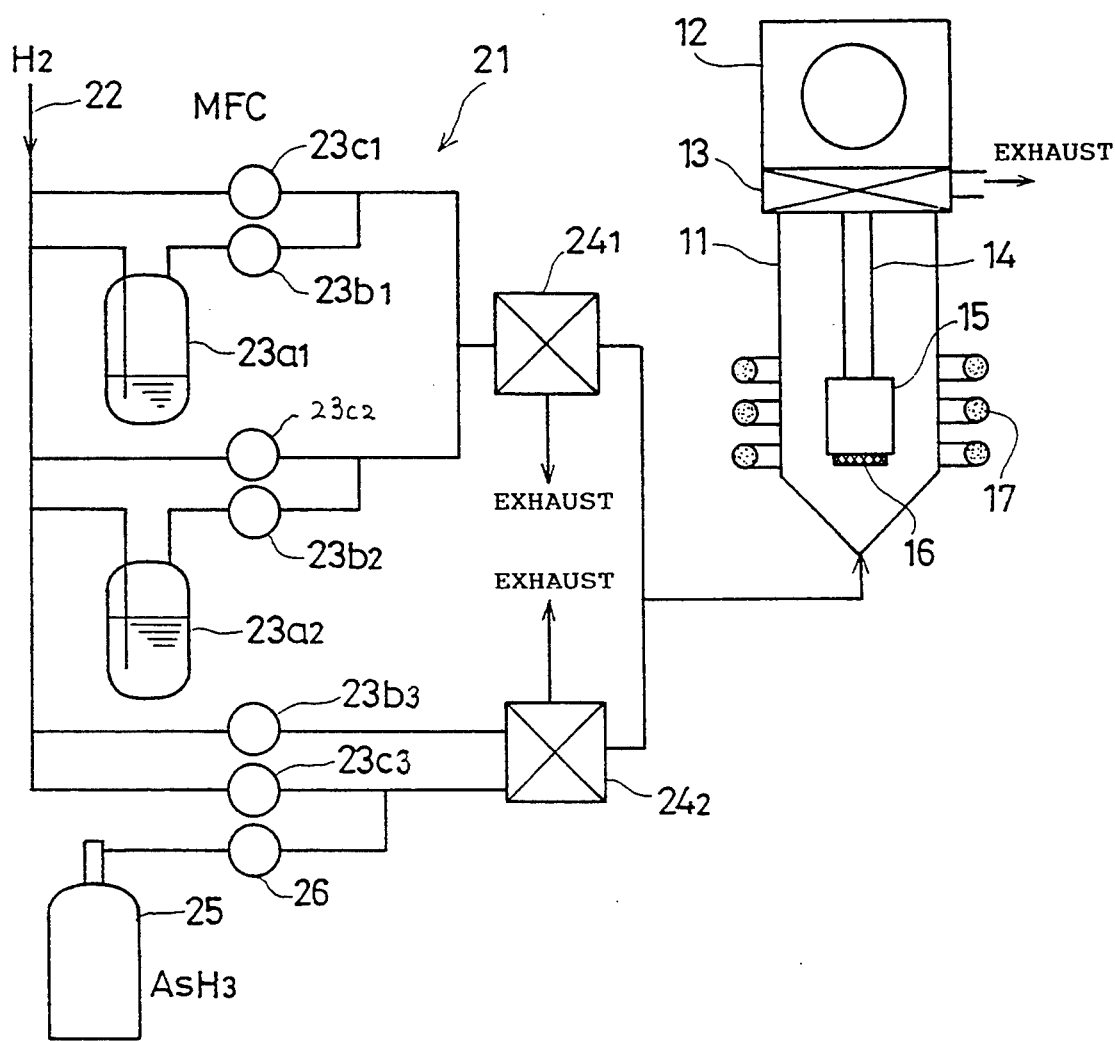
FIG. 1 is a diagram showing the apparatus used in the present invention for growing a crystal layer.

FIG. 1 shows the construction of an apparatus 10 used in the present invention for conducting the epitaxial growth of semiconductor layers. It should be noted that the apparatus 10 itself is the one that has been used conventionally in the art of atomic layer epitaxy or MOCVD.

Referring to FIG. 1, the apparatus 10 includes a reaction vessel 11 that is evacuated by a vacuum pump 12 and a valve 13, wherein the reaction vessel 11 is equipped therein with a piping system 21 for supplying the source material of the compound semiconductor crystal to be grown. The reaction vessel 11 includes a susceptor 15 that is mounted at the tip end of a rod 14, and a substrate 16 is held on the susceptor 15. Thereby, the semiconductor crystal is grown on the substrate 16. In order to control the temperature of growth, there is provided a coil 17 to surround the reaction vessel 11 in correspondence to the susceptor 15.

The piping system 21 includes a carrier gas line 22 that is supplied with a carrier gas such as $H_2$, wherein the carrier gas is supplied further via the line 22 to containers $23a_1$ and $23a_2$ that hold therein the source materials of the foregoing compound semiconductor crystal. The carrier gas thereby causes a bubbling in the containers $23a_1$ and $23a_2$. It should be noted that the containers $23a_1$ and $23a_2$ are held at respective predetermined temperatures and gaseous source materials are formed in the containers $23a_1$ and $23a_2$ as a result of the bubbling. The gaseous source materials thus formed are then supplied to the reaction vessel 11 via mass flow controllers $23b_1$ and $23b_2$ as well as via switch valves $24_1$ and $24_2$ that are provided in correspondence to the containers $23a_1$ and $23a_2$. By controlling the temperature of the containers $23a_1$ and $23a_2$ as well as the flowrate of the carrier gas that causes the bubbling in the containers, one can control the flowrate of In and Ga that are supplied to the reaction vessel 11 with a high precision. In order to flush the valves $24_1$ and $24_2$ as well as the lines connected thereto, there are provided bypass lines equipped with mass flow controllers $23c_1$ and $23c_2$. Further, there is provided a container 25 of arsine ($AsH_3$) as the source of As, wherein the container 25 supplies an arsine gas to the reaction vessel 11 via a mass flow controller 26 and the foregoing switch valve $24_2$.

By using the apparatus of FIG. 1, one can achieve a crystal growth according to the process of the atomic layer epitaxy. When carrying out such a process of the atomic layer epitaxy, the valves $24_1$ and $24_2$ are controlled by an external apparatus such that the gaseous source materials of In, Ga and As are supplied to the reaction vessel repeatedly and periodically according to a sequence of In, As, Ga and As, with a flushing by $H_2$ interposed between the steps for supplying of the source gases. Of course, one may provide different containers for different source materials in correspondence to the composition of the compound semiconductor material to be grown.

In the conventional atomic layer epitaxy, the containers $23a_1$ and $23a_2$ hold therein materials such as TMG or TMI as the source of Ga and In. Thereby, there has been a difficulty in growing a mixed crystal of InGaAs wherein the Ga atoms and the In atoms are ordered, as explained already.

Hereinafter, a first embodiment of the present invention will be described. The first embodiment of the present invention relates to the process of growing an InAs layer on a GaAs substrate by means of the atomic layer epitaxy at a temperature higher than the conventionally employed temperature of atomic layer epitaxy.

In the present embodiment, trimethylindium dimethylethylamine adduct [$(CH_3)_3In.N(CH_3)_2C_2H_5$; TMIDEA], an amine-adduct of TMI, is accommodated in the container $23a_1$ or $23a_2$ of the apparatus of FIG. 1 in place of conventionally used TMI, and a vapor of TMIDEA, formed as a result of bubbling by $H_2$, is supplied to the reaction vessel 11 via the mass flow controller $23b_1$ or $23b_2$ and the valve $24_1$ or $24_2$.

TMIDEA used in the present embodiment is synthesized from TMI and dimethylethylamine [$N(CH_3)_2(C_2H_5)$] in ethanol according to a reaction

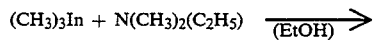

and is available from Tri Chemical Laboratory, Inc. of Aikawa-machi, Aikou-gun, Kanagawa, Japan as trimethylindium dimethylethylamine adduct.

The foregoing compound is obtained by mixing equal amounts of $(CH_3)In$ and $N(CH_3)_2(C_2H_5)$ followed by condensation and distillation, and is characterized by a single boiling point of 80° C. This indicates that the product of the foregoing reaction is made of a single compound. As the foregoing boiling point of 80° C. is different from any of the boiling point of $(CH_3)_3In$ (135.8° C.) and the boiling point of $N(CH_3)_2(C_2H_5)$ (37.5° C.), and as there is no other possible reactions in this system, it is believed that the foregoing reaction has really taken place to produce TMIDEA as indicated at the right hand side of the foregoing reaction.

TMIDEA thus obtained is chemically stable over TMI as demonstrated by the equilibrium vapor pressure. It should be noted that equilibrium vapor pressure of TMI at 80° C. is about 25 Torr, while the equilibrium vapor pressure of TMIDEA is only 9 Torr at the same temperature. It is believed that such a stabilization of the compound occurs as a result of the interaction between In in TMI and N in the dimethylethylamine. The thermal stability of TMIDEA might be higher than that of TMI which is a conventional In source. An additional benefit of TMIDEA in MOVPE or chemical beam epitaxy (CBE) is its reactivity in the air, which is nonpyrophoric, thus enabling safe handling.

The inventor of the present invention has conducted a series of experiments of atomic layer epitaxy while using the apparatus of FIG. 1, wherein a crystal layer of InAs was grown on the substrate 16 while supplying TMIDEA and arsine alternately into the reaction vessel 11. In the experiment, a (100)-oriented GaAs single crystal was used for the substrate 16, and the epitaxial growth was made at a substrate temperature of 460° C. while holding the internal pressure of the reaction vessel 11 at about 15 Torr. The bubbling temperature of TMIDEA was set to 19.2° C. in the container $23a_1$, and the flowrate of TMIDEA was set to 100 SCCM in correspondence thereto. Further, arsine was supplied with a flowrate of 100 SCCM. Similarly to conventional MOCVD processes, the gaseous source materials experience a pyrolytic decomposition in the vicinity of the substrate surface and release the elements that constitute the compound semiconductor crystal layer to be grown on the substrate. Thereby, the elements thus released are settled in corresponding crystallographic sites and the desired layer of the compound semiconductor crystal grows on the surface of the substrate.

In the present embodiment, TMIDEA and arsine were supplied alternately with a flushing of $H_2$ interposed between the step of supplying TMIDEA and the step of supplying arsine, wherein the flushing was made for about 0.5 seconds. In the experiments, the self-limiting effect was examined by changing the duration for supplying TMIDEA while setting the duration for supplying arsine at 10 seconds. The following TABLE I shows the growth condition for one cycle of the sequence.

TABLE I

| substrate temperature = 460° C., pressure = 15 Torr | | | | |
|---|---|---|---|---|
| | H$_2$ purge | TMIDEA | H$_2$ purge | AsH$_3$ |
| flowrate (SCCM) | — | 100 | — | 100 |
| time (seconds) | 0.5 | X | 0.5 | 10 |

Figure 2:
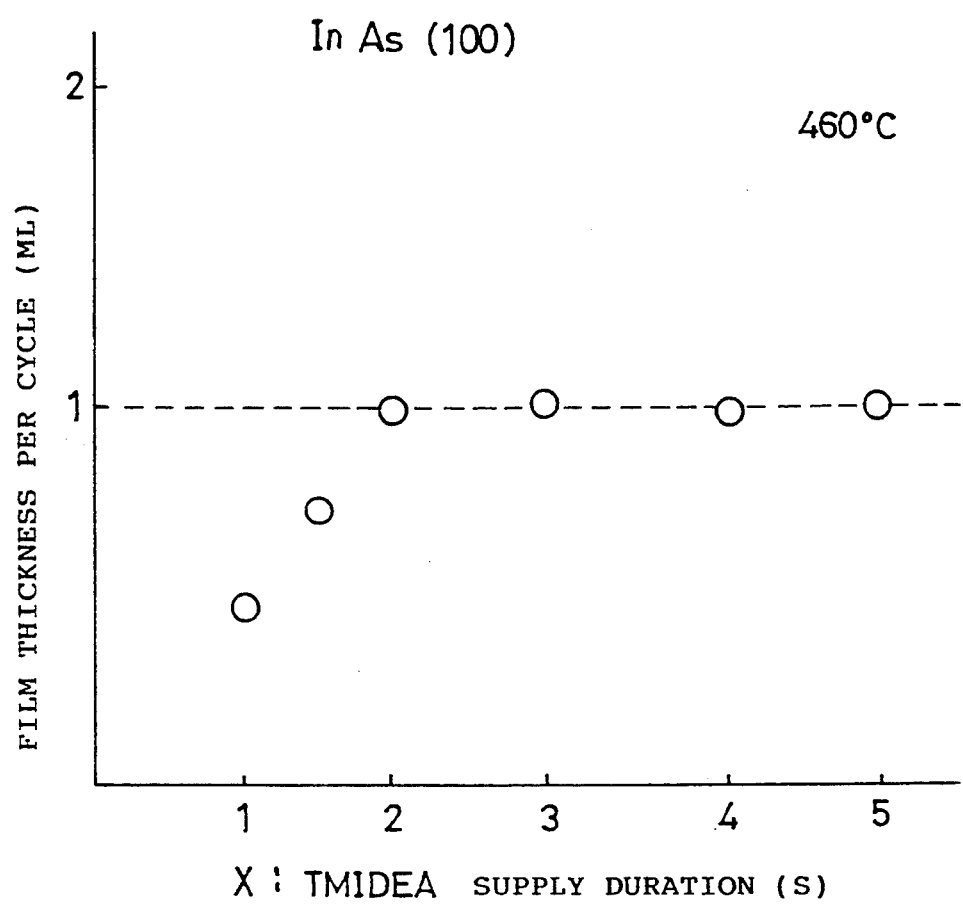
FIG. 2 is a diagram showing a first embodiment of the present invention wherein the growth of an (100)-oriented InAs layer is achieved by an atomic layer epitaxy that uses TMIDEA and arsine.

FIG. 2 shows the thickness of the (100)-oriented InAs layer obtained per one cycle of the foregoing atomic layer epitaxy process, wherein the result of FIG. 2 is obtained from the experiments in which the foregoing cycle is repeated for thirty times. In FIG. 2, it should be noted that the vertical axis represents the thickness of the layer represented in terms of the number of molecular layers while the horizontal axis represents the duration X for supplying TMIDEA. As will be noted from FIG. 2, one molecular layer of InAs grows after one cycle of the atomic layer epitaxy process, provided that the duration X for supplying TMIDEA is set to about 2 seconds. Further, it was discovered that no further increase occurs in the thickness of the InAs layer even when continuous supplying of TMIDEA is made, indicating the existence of a clear self-limiting effect even at the temperature well exceeding 400° C. Thus, the same results were obtained when an InAs substrate was used.

Next, a second embodiment of the present invention will be described.

In the present embodiment, a GaAs layer is grown according to the atomic layer epitaxy process, wherein triethylgallium-dimethylethylamine adduct [(C$_2$H$_5$)$_3$Ga.N(CH$_3$)$_2$C$_2$H$_5$; TEGDEA] is used as the source of Ga. Thus, in the present embodiment, the container 23a$_1$ or 23a$_2$ holds therein TEGDEA and supplies a vapor of TEGDEA, formed as a result of bubbling by the H$_2$ carrier gas, to the reaction vessel 11 via the mass flow controller 23b$_1$ or 23b$_2$ and the corresponding valve 24$_1$ or 24$_2$.

TEGDEA is formed as a result of a reaction between TEG and dimethylethylamine [N(CH$_3$)$_2$(C$_2$H$_5$)] in n-pentane, represented as

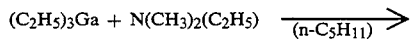
(C$_2$H$_5$)$_3$Ga + N(CH$_3$)$_2$(C$_2$H$_5$) $\xrightarrow{\text{(n-C}_5\text{H}_{11})}$

(C$_2$H$_5$)$_3$Ga.N(CH$_3$)$_2$(C$_2$H$_5$)

and is available from the Tri Chemical Laboratory Inc. op cit., as triethylgallium dimethylethylamine adduct. The product of the foregoing reaction is characterized a single boiling point of 72° C., wherein such a single boiling point indicates that the material is a single compound. It should be noted that the compounds at the left hand side of the above reaction have the boiling points of 142.6° C. and 37.5° C. respectively The following TABLE II shows the result of the chemical analysis conducted on the product of the foregoing reaction. In TABLE II below, it should be noted that the calculated value represents the ideal composition of triethylgallium dimethylethylamine adduct having the composition C$_{10}$H$_{26}$NGa. It will be noted that there is an excellent agreement between the result of analysis and the predicted composition, indicating that the obtained compound is indeed triethylgallium dimethylethylamine adduct.

TABLE II

| | analysis (%) | calculated (%) |
|---|---|---|
| C | 50.17 | 52.21 |
| H | 11.12 | 11.39 |
| N | 5.31 | 6.09 |

Similarly to the case of TMIDEA, TEGDEA is chemically more stable as compared with TEG as clearly indicated by the value of the equilibrium vapor pressure. More specifically, the equilibrium vapor pressure of TEGDEA is only 0.15 Torr at 72° C. which is significantly lower than the equilibrium vapor pressure of TEG at the same temperature. At 72° C., the equilibrium vapor pressure of TEG is about 50 Torr. Again, such a stabilization of the compound is believed to be caused as a result of the interaction between Ga in TEG and N in dimethylethylamine adduct that is added to TEG.

Next, the result of experiments for growing a GaAs layer by the atomic layer epitaxy will be described, wherein the experiments were made by using the apparatus of FIG. 1 by supplying TEGDEA and arsine alternately. In the present experiments, too, the pressure of the reaction vessel 11 was set to 15 Torr and the substrate temperature was set to 460° C. Further, the bubbling temperature of the container 23a$_1$ was set to 17° C. Similarly to the previous experiments for the growth of InAs layer, a GaAs crystal having a (100)-oriented major surface was used as the substrate 16, and the self-limiting effect was examined by changing the flowrate of TEGDEA variously while holding the flowrate of arsine at 100 SCCM. Similarly to the ordinary atomic layer epitaxy, the supply of TEGDEA and the supply of arsine were made alternately, with an intervening flushing process by H$_2$ that continues for 0.5 seconds. In the experiments, the duration for supplying TEGDEA was set to 6 seconds while the duration for supplying arsine was set to 10 seconds. The growth condition for one cycle of the atomic layer epitaxy is listed in the following TABLE III.

TABLE III

| substrate temperature = 460° C., pressure = 15 Torr | | | | |
|---|---|---|---|---|
| | H$_2$ purge | TEGDEA | H$_2$ purge | AsH$_3$ |
| flowrate (SCCM) | — | X | — | 100 |
| time (seconds) | 0.5 | 6 | 0.5 | 10 |

Figure 3:
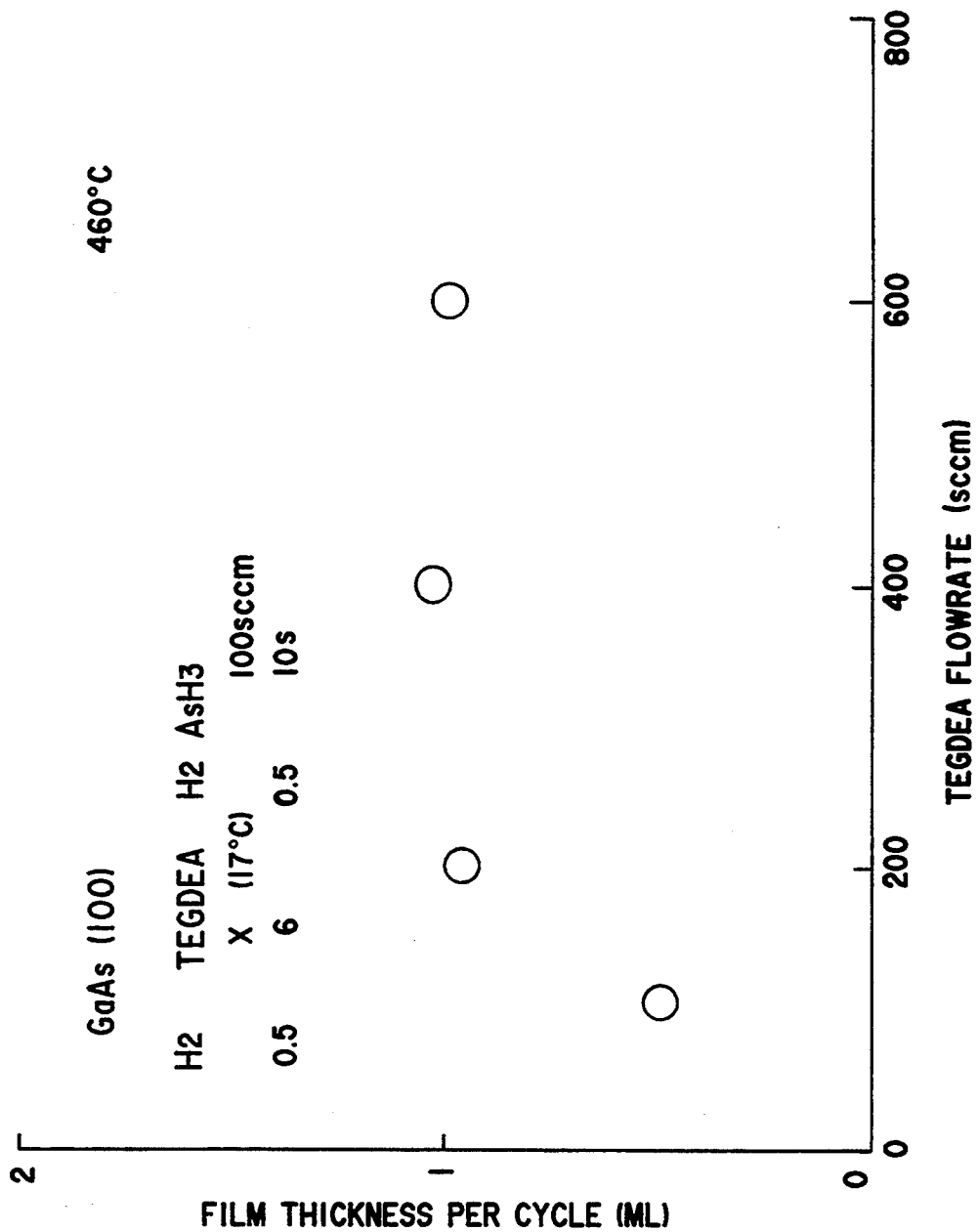
FIG. 3 is a diagram showing a second embodiment of the present invention wherein the growth of an (100)-oriented GaAs layer is achieved by an atomic layer epitaxy that uses TEGDEA and arsine.

FIG. 3 shows the thickness of the (100)-oriented GaAs crystal layer obtained by repeating the process of TABLE III for 354 times. In FIG. 3, the vertical axis represents the thickness of the GaAs layer obtained per one cycle in terms of the number of molecular layers while the horizontal axis represents the flowrate X of TEGDEA represented in terms of SCCM. It will be noted from FIG. 3 that the one can achieve a growth of the GaAs layer for one molecular layer in one cycle of the atomic layer epitaxy process when the flowrate of TEGDEA is set to about 200 SCCM, while the thickness of the GaAs layer does not increase further even when the flowrate is increased. In other words, the growth of GaAs by the atomic layer epitaxy of TEGDEA and arsine shows a clear self-limiting effect at the temperature well exceeding the conventional temperature limit of 400° C.

Next, an optical semiconductor device according to a third embodiment of the present invention will be described with reference to FIG. 4.

Figure 4:
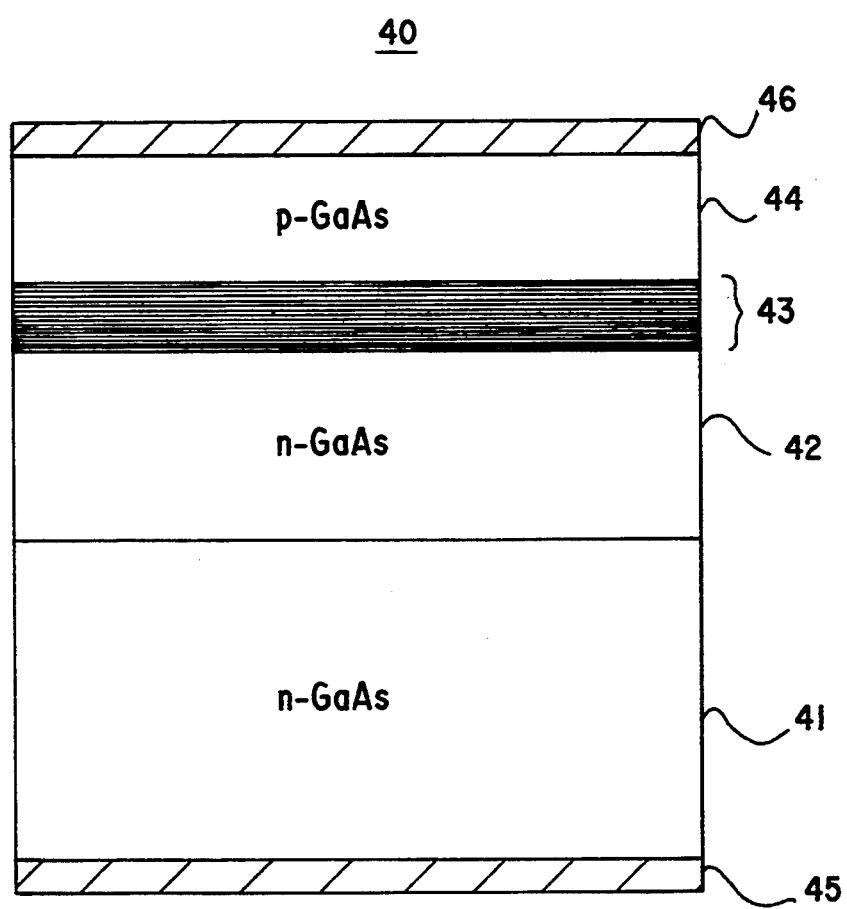
FIG 4 is a diagram showing the structure of an optical semiconductor device according to third and fourth embodiments of the present invention.

Referring to FIG. 4 showing the structure of the optical semiconductor device of the present embodiment, the device is constructed on an n-type GaAs substrate 41 that is covered by a buffer layer 42 of n-type GaAs deposited by an ordinary MOCVD process. On the buffer layer 42, there is provided an undoped active layer 43 of InGaAs having a superlattice structure represented as $(GaAs)_1(InAs)_1$, wherein the InGaAs layer 43 is formed according to the atomic layer epitaxy process to be described later in detail. The active layer 43 is covered by a p-type GaAs layer 44 grown by an ordinary MOCVD process, and ohmic electrodes 45 and 46 are provided on the lower major surface of the substrate 41 and the upper major surface of the GaAs layer 44, respectively.

In operation, carriers are injected into the active layer 43 via the electrodes 45 and 46, wherein the carriers thus injected cause a recombination in the active layer 43 to cause an emission of photons therein. Thus, the device of FIG. 4 operates as an optical semiconductor device. When mirrors are formed at both opposing ends of the active layer 43, the device operates as a laser diode. Further, one can form a quantum well layer in the active layer 43 by setting the thickness of the active layer 43 substantially small. It should be noted that the active layer 43 is sandwiched vertically by the GaAs layers 42 and 44 that have a larger bandgap.

It should be noted that there has been a persistent demand for a laser diode that oscillates at a wavelength of 1.3 μm band, while such large wavelengths have been difficult to be attained by the conventional GaAs laser diodes. In order to obtain a laser oscillation at such large wavelengths, it is necessary to use a semiconductor material having a small bandgap for the active layer of the laser diode. Although such an active layer having a small bandgap can be obtained by using a mixed crystal of GaAs and InAs, one has to incorporate a substantial amount of In into the active layer in order to obtain the necessary value of the bandgap. Thereby, there arises a problem of lattice mismatch between the active layer and the GaAs substrate, and such a lattice mismatch invites an accumulation of distortions in the active layer. As a result, the laser oscillation has been generally unsuccessful in such laser diodes.

Figure 5:
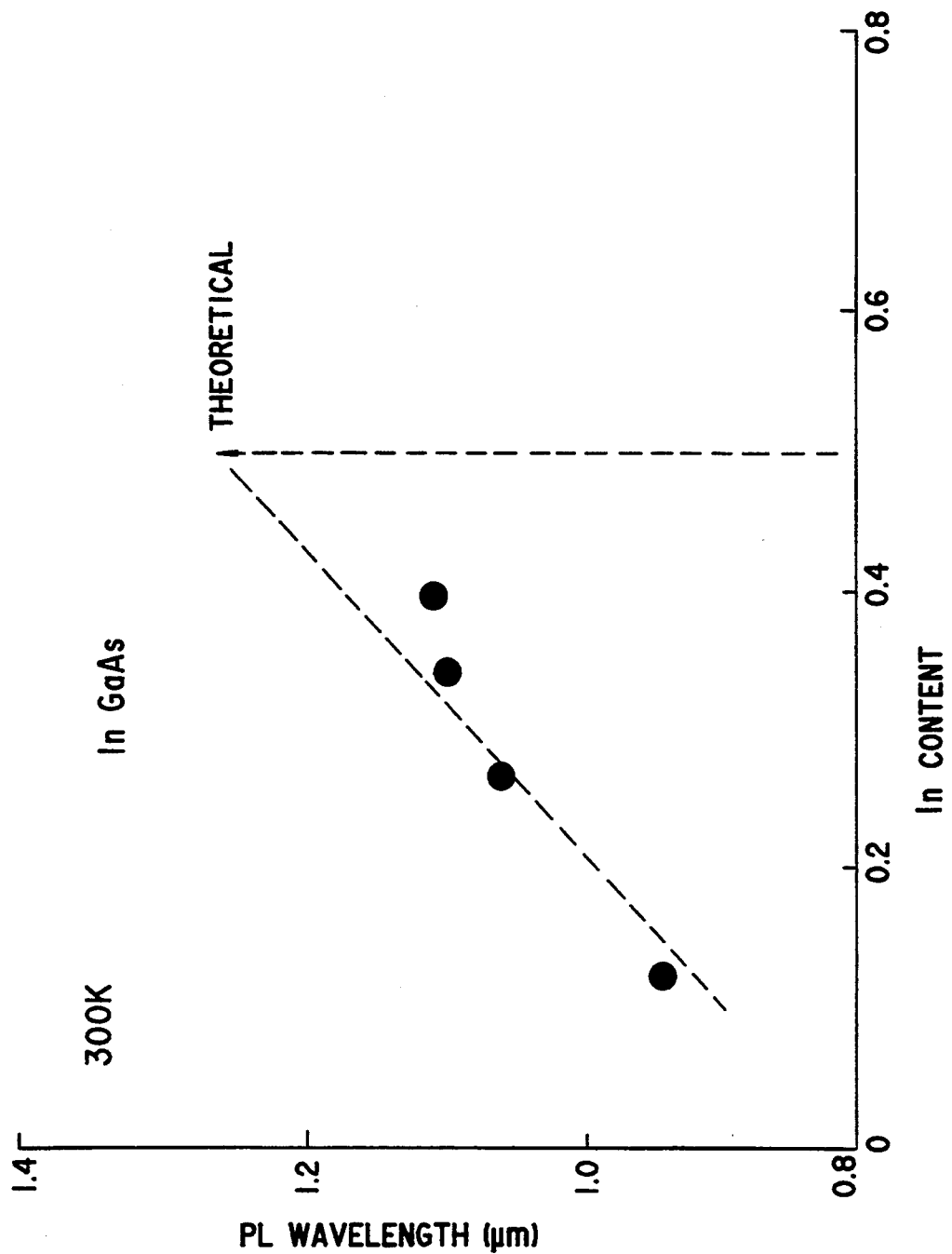
FIG. 5 is a diagram showing the relationship between the composition of an InGaAs layer and the photoluminescent wavelength.

FIG. 5 shows the relationship between the composition of the InGaAs quantum well layer used for the active layer 43 of the laser diode of FIG. 4 and the photoluminescent wavelength (PL wavelength) obtained at a temperature of 300K. As will be noted from FIG. 5, the PL wavelength increases with increasing In content in the active layer 43, while it has been impossible to increase the PL wavelength beyond the value of 1.2 μm because of the excessive lattice mismatch between the active layer 43 and the substrate 41. It should be noted that the In content for the PL wavelength of 1.2 μm is about 0.4. In order to obtain the laser oscillation at the wavelength of 1.3 μm, it is necessary to use the composition of $In_{0.5}Ga_{0.5}As$ for the active layer 43.

In the present embodiment, the active layer 43, grown as a result of the atomic layer epitaxy that includes the alternate deposition of a Ga monoatomic layer and an In monoatomic layer, is characterized by the high degree of ordering and has a composition represented as $(InAs)_1(GaAs)_1$. As a result, the InGaAs active layer 43 provides a satisfactory lattice matching to the GaAs substrate 41 even when the In content therein reaches as much as 50%. Thereby, one can obtain the desired laser oscillation at a wavelength of 1.3 μm.

Figure 6:
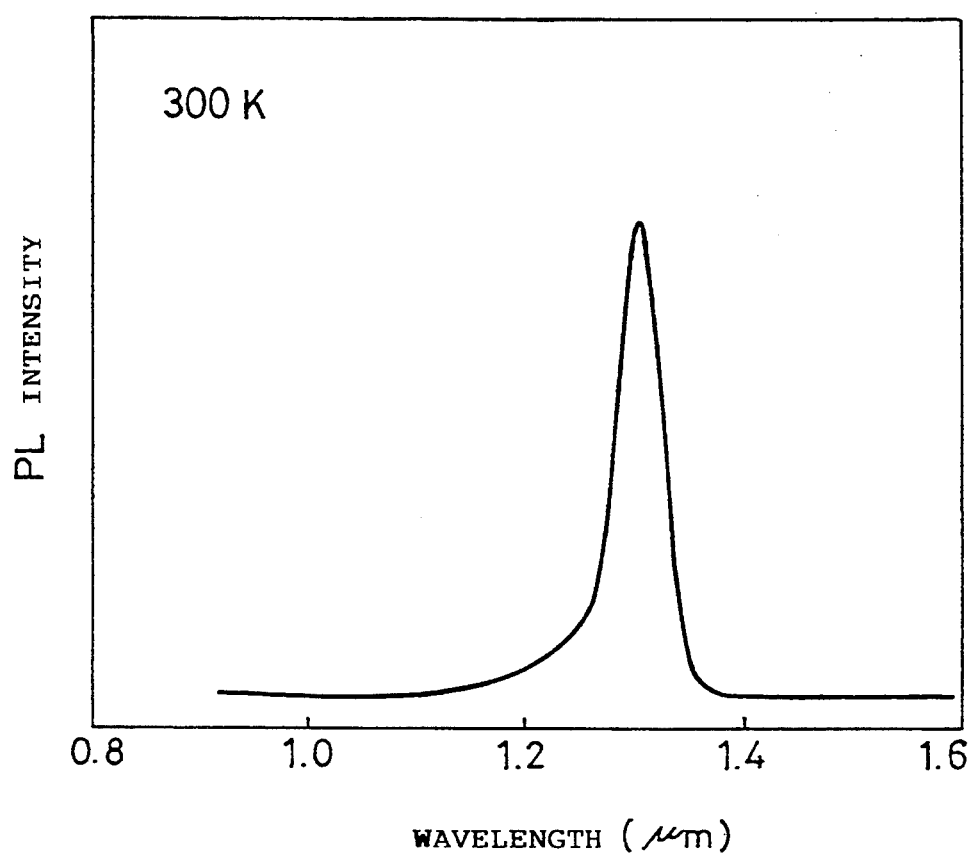
FIG. 6 is a diagram showing the photoluminescent spectrum obtained by the InGaAs layer grown by an atomic layer epitaxy of TEGDEA.

FIG. 6 shows the photoluminescent spectrum obtained by the optical semiconductor device that uses the active layer 43 grown in accordance with the atomic layer epitaxy of the present invention. The spectrum of FIG. 6 was obtained at the operational temperature of 300K. As will be noted in FIG. 6, a clear and distinct photoluminescence was observed at the wavelength of 1.3 μm. This indicates that the active layer 43 has a composition of $In_{0.5}Ga_{0.5}As$ that provides a bandgap for the wavelength of 1.3 μm. The fact that such a clear photoluminescence is observed at the wavelength of 1.3 μm indicates that the defect density of the active layer 43 is sufficiently small in correspondence to the artificial superlattice structure represented as $(InAs)_1(GaAs)_1$ such that an efficient emission of photons is achieved as a result of the interband transition of carriers. As described already, it is believed that such a decrease in the defect density is achieved as a result of the formation of the artificial superlattice structure that reduces the lattice constant in the InGaAs crystal as a result of the ordering of Ga and In as compared with the structure wherein the Ga and In atoms are distributed at random in the InGaAs crystal, such that a satisfactory lattice matching is achieved between the active layer 43 and the GaAs substrate 41.

Next, the fabrication process of the device of FIG. 4 will be described.

In the fabrication of the device of FIG. 4, the apparatus 10 of FIG. 1 is used. Thereby, the container $23a_1$ accommodates TMI while the container $23a_2$ accommodates TEGDEA. Further, the substrate 41 is mounted upon the susceptor 15 in place of the substrate 16. In addition, TEG is filled in another container not illustrated in FIG. 1.

In the fabrication process, the temperature of the substrate 41 is set to 460° C. and the internal pressure of the reaction vessel set to 15 Torr, and TEG is supplied to the reaction vessel 11 with a flowrate of 25 SCCM together with arsine with a flowrate of 100 SCCM such that the growth of the GaAs buffer layer 42 is made on the substrate 41 with a thickness of 5000 Å. In this process, a bubbling of TEG is made at 17° C. After the buffer layer 42 is thus formed, the process of atomic layer epitaxy is started wherein TMI held in the container $23a_1$, TEGDEA held in the container $23a_2$ and arsine held in the container 25 are supplied repeatedly and sequentially with an intervening flushing process by the $H_2$ carrier gas. Thereby, the active layer 43 is grown on the buffer layer 42 with the superlattice structure of $(GaAs)_1(InAs)_1$.

More specifically, the piping system 21 including supply lines as well as the reaction vessel 11 are flushed by the $H_2$ carrier gas at first while holding the substrate temperature and the vessel pressure at 460° C. and 15 Torr respectively, and arsine is supplied from the container 25 to the reaction vessel 11. As a result, a monoatomic layer of As grows on the GaAs buffer layer 42. Next, the piping system 21 as well as the reaction vessel 11 are flushed again by the $H_2$ carrier gas, and the supply of TMI is started from the container $23a_1$ to the reaction vessel 11. As a result, one monoatomic layer of In grows on the As monoatomic layer grown by the previous process. Further, the piping system 21 as well as the reaction vessel 11 are flushed again and the supply of As is carried out again from the container 25 to the reaction vessel 11 to grow a monoatomic layer of As on the In monoatomic layer grown previously. Next, the piping system 21 and the reaction vessel 11 are again flushed by the H$_2$ gas, and the supply of TEGDEA is made from the container 23a$_2$ to the reaction vessel 21 to grow a monoatomic layer of Ga on the monoatomic layer of As grown previously. By repeating the foregoing steps a number of times, one can obtain the active layer 43 of InGaAs that has the artificial superlattice structure as described already.

In the forgoing process of the atomic layer epitaxy, the temperature of the container 23a$_1$ for holding TMI is set to 19.2° C. while the temperature of the container 23a$_2$ for holding TEGDEA is set to 17° C. The following TABLE IV shows the one cycle of the process of atomic layer epitaxy for growing the active layer 43.

TABLE IV

| substrate temperature = 460° C., pressure = 15 Torr | | | | |
|---|---|---|---|---|
| | H$_2$ purge | TMI | H$_2$ purge | AsH$_3$ |
| flowrate (SCCM) | — | 100 | — | 400 |
| time (seconds) | 0.5 | 0.4 | 0.5 | 10 |
| | H$_2$ purge | TEGDEA | H$_2$ purge | AsH$_3$ |
| flowrate (SCCM) | — | 400 | — | 400 |
| time (seconds) | 0.5 | 4.0 | 0.5 | 5 |

By repeating the foregoing sequence for about twelve times, the active layer 43 having the composition of (GaAs)$_1$(InAs)$_1$ is grown with a thickness of about 70 Å, and the GaAs cap layer 44 is grown on the active layer 43 thus formed by the ordinary MOCVD process that uses TEG with a thickness of about 500 Å. The growth of the cap layer 44 may be made under the condition identical with the condition for growing the buffer layer 42. The optical semiconductor device of FIG. 4 is completed by providing the ohmic electrodes 45 and 46 respectively on the upper and lower major surfaces of the layered semiconductor body thus formed by a sputtering process. As noted previously, the device thus formed operates as a laser diode when the carriers are injected from the electrodes 45 and 46.

Next, a fourth embodiment of the present invention for fabricating an optical semiconductor device will be described.

In the present embodiment, the semiconductor device has a structure substantially identical with the structure of the device of FIG. 4 except that the active layer 43 is grown by the atomic layer epitaxy of TMIDEA and TEGDEA. The following TABLE V shows the detailed condition for growing the active layer 43 according to the present embodiment.

TABLE V

| substrate temperature = 460° C., pressure = 15 Torr | | | | |
|---|---|---|---|---|
| | H$_2$ purge | TMIDEA | H$_2$ purge | AsH$_3$ |
| flowrate (SCCM) | — | 100 | — | 400 |
| time (seconds) | 0.5 | 0.4 | 0.5 | 10 |
| | H$_2$ purge | TEGDEA | H$_2$ purge | AsH$_3$ |
| flowrate (SCCM) | — | 400 | — | 400 |
| time (seconds) | 0.5 | 4.0 | 0.5 | 5 |

In the present embodiment, the temperature of the container 23a$_1$ that holds TMIDEA is set to 19.2° C. while the temperature of the container 23a$_2$ that holds TEGDEA is set to 17° C.

Figure 7:
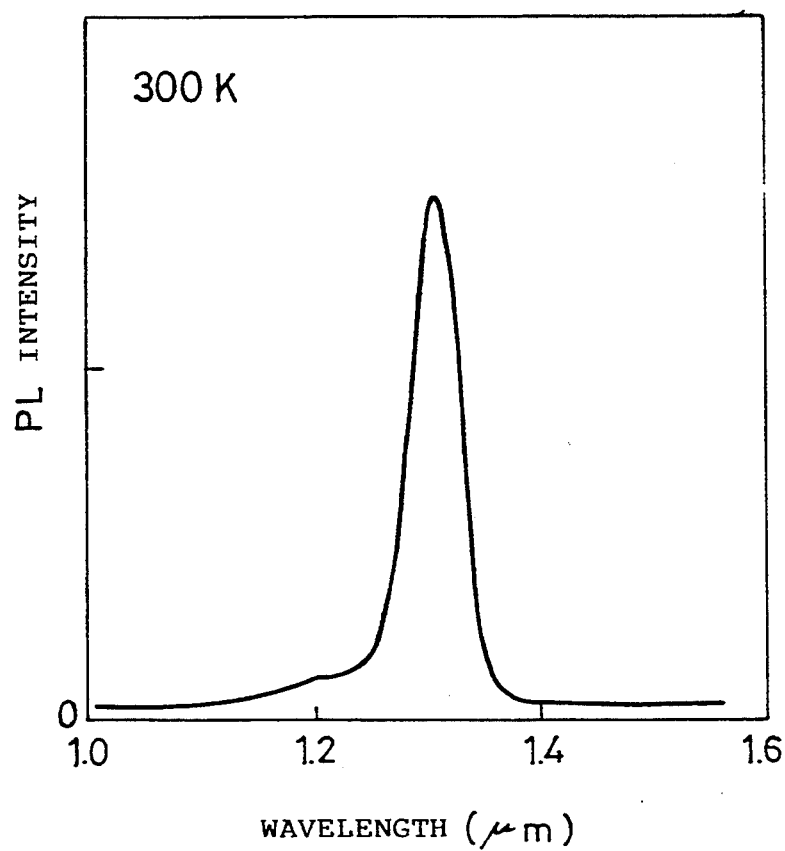
FIG. 7 is a diagram showing the photoluminescent spectrum obtained by the InGaAs layer formed by the atomic layer epitaxy of TMIDEA and TEGDEA.

FIG. 7 shows the photoluminescent spectrum obtained by the optical semiconductor device that has the active layer 43 formed according to the process of the TABLE V. The observation of the photoluminescence was made at 300K similarly to the previous embodiments. It will be noted from FIG. 7 that a clear and distinct spectrum appears at the wavelength of about 1.3 μm in the device of the present embodiment, indicating an efficient laser oscillation at this wavelength.

Next, a fifth embodiment of the present invention will be described with reference to FIG. 8, which shows a laser diode 50.

Figure 8:
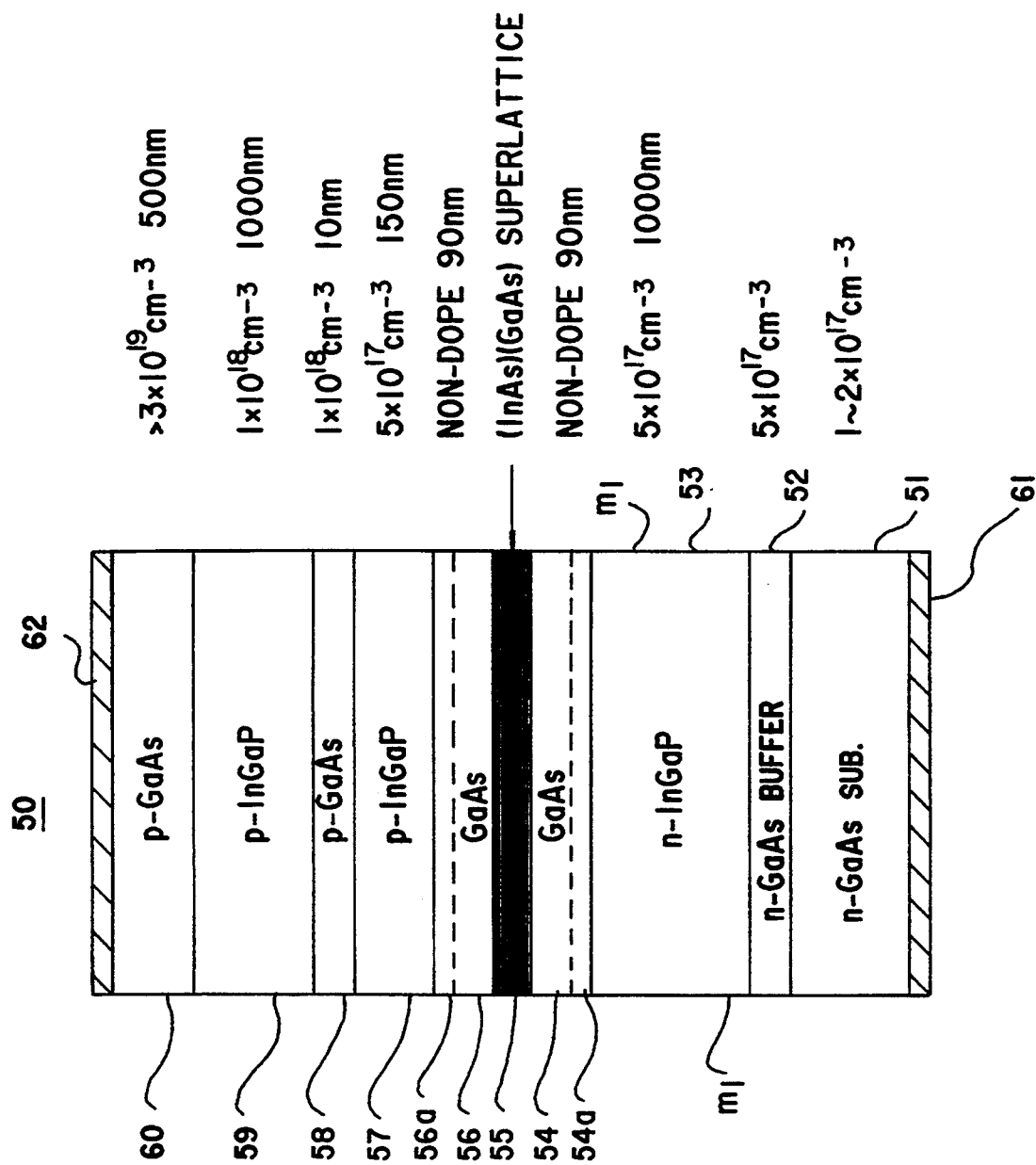
FIG. 8 is a diagram showing the structure of a laser diode according to a fifth embodiment of the present invention.

Referring to FIG. 8, the laser diode of the present embodiment is constructed on an n-type substrate 51 of a GaAs single crystal doped to have an impurity concentration level of $1-2 \times 10^{17}$cm$^{-3}$, wherein an epitaxial layer of GaAs is provided on the substrate 51 as a buffer layer 52. The buffer layer 52 is doped to the n-type with an impurity concentration level of $5 \times 10^{17}$cm$^{-3}$ and there is provided a lower cladding layer 53 of InGaP on the buffer layer 52 with an impurity concentration level of $5 \times 10^{17}$cm$^{-3}$. The lower cladding layer 53 is grown epitaxially on the buffer layer 52 with a thickness of about 1000 nm, and an undoped layer 54 of GaAs is grown epitaxially on the cladding layer 53 with a thickness of about 90 nm. The layers 52–54 may be formed by ordinary MBE or MOCVD processes, wherein a transition region 54a that contains an n-type dopant is formed in the undoped GaAs layer 54 along the boundary to the layer 53.

On the GaAs layer 54, there is provided an InGaAs layer 55 having a composition and a construction identical with those of the InGaAs active layer 43 described in the foregoing third embodiment, according to the atomic layer epitaxy of TEGDEA and TMI. Alternatively, one may form the layer 55 according to the atomic layer epitaxy of TEGDEA and TMIDEA. In the latter case, the atomic layer epitaxy is carried out under the condition described with reference to FIG. 2, by using TMIDEA in place of TMI.

On the active layer 55 thus formed, there is provided an undoped GaAs layer 56 epitaxially with a thickness of about 90 nm, and a layer 57 of InGaP is grown epitaxially further on the GaAs layer 56 with a thickness of about 150 nm. The layer 57 is doped to the p-type with an impurity concentration level of $5 \times 10^{17}$cm$^{-3}$ and there is formed a transition region 56a in the layer 56 along the boundary to the layer 57 similarly to the transition region 54a, wherein the transition region 56a contains p-type dopants. On the layer 57, a p-type GaAs layer 58 is grown epitaxially with an impurity concentration level of $1 \times 10^{18}$cm$^{-3}$ and another layer 59 of p-type InGaAs is grown on the layer 58 with a thickness of about 1000 nm, wherein the layer 59 is doped to the impurity concentration level of $1 \times 10^{18}$cm$^{-3}$. Further, a layer 60 of p-type GaAs is grown epitaxially on the layer 59 with a thickness of about 500 nm, wherein the layer 60 is doped to an impurity concentration level exceeding the level of $3 \times 10^{19}$cm$^{-3}$ and acts as a contact layer of the laser diode 50. Further, ohmic electrodes 61 and 62 are provided respectively on the lower major surface of the substrate 51 and the upper major surface of the contact layer 60. The layered semiconductor body of the laser diode 50 thus formed is further cleaved at longitudinal ends thereof to form a pair of mutually opposing mirrors m$_1$ and m$_2$.

As the active layer 55 of the laser diode 50 has the superlattice structure represented as (InAs)$_1$(GaAs)$_1$ as a result of the atomic layer epitaxy that uses the amine-adducts of alkyl compounds of In or Ga, one can obtain an efficient laser oscillation even at the wavelength of the 1.3 μm band.

It should be noted that the amine adducts of alkyl compounds of the group III element such as TMIDEA or TEGDEA described before are useful not only in the atomic layer epitaxy but also when growing a crystal layer according to the ordinary MOCVD process. In such a case, the compounds such as TMIDEA or TEGDEA in the containers $23a_1$ and $23a_2$ are supplied to the reaction vessel 11 together with arsine from the container 25 to form a layer of GaAs, InAs or the mixed crystal thereof. As TMIDEA or TEGDEA does not cause spontaneous ignition when contacted with air contrary to conventional TMI or TEG, the handling of these source materials is easy. Thus, the use of the amine adducts of alkyl compounds of group III elements is advantageous for mass-producing compound semiconductor devices. When using these novel source materials to the ordinary MOCVD process, there is of course no limitation in the optimum temperature as in the case of the atomic layer epitaxy, and a very large deposition rate can be achieved by causing the deposition at higher temperatures as compared to the temperature used in the atomic layer epitaxy.

Further, the method of forming semiconductor layers according to the present invention is useful not only in the growth of single crystal layers but also when growing polycrystal layers. Hereinafter, a sixth embodiment of the present invention will be described wherein a polycrystal semiconductor layer is grown from a gaseous source material.

In the present embodiment, a silicon oxide layer is deposited on a GaAs substrate in order to achieve the growth of a polycrystal semiconductor layer, and a GaAs polycrystal layer is deposited on the silicon oxide layer as a result of the pyrolytic decomposition of TEGDEA and arsine. Similarly to the previous embodiments, the growth of the polycrystal layer is achieved in the apparatus of FIG. 1, wherein the substrate temperature is set to 350° C. and the internal pressure of the reaction vessel 11 set to 15 Torr. The following TABLE VI summarizes the condition used for growing a polycrystal GaAs layer in the present embodiment.

TABLE VI

| substrate temperature = 350° C., pressure = 15 Torr | | | |
|---|---|---|---|
| | $H_2$ purge | TEGDEA | $H_2$ purge | $AsH_3$ |
| flowrate (SCCM) | — | 400 | — | 100 |
| time (seconds) | 0.5 | 10 | 0.5 | 10 |

It should be noted that the growth of the polycrystal GaAs layer is by no means limited to the foregoing atomic layer epitaxy process of TABLE VI wherein TEGDEA and arsine are supplied alternately, but may be achieved according to the ordinary MOCVD process or MBE process in which TEGDEA or TMIDEA is used simultaneously with arsine.

Further, the method of the present invention to grow a semiconductor layer from a gaseous source material of amine-adduct compound is effective also when growing a layer of a compound semiconductor material that contains Al from a source material of alane ($AlH_3$). Conventionally, an MBE process for growing a compound semiconductor layer that contains Al has been achieved by using trimethylaluminum [$(CH_3)_3Al$; TMA] as the source of Al. In this conventional process, however, there exists a problem in that a contamination of the semiconductor layer tends to occur by carbon (C) or oxygen (O) that are contained in the source material of Al. In order to avoid this problem, there is a proposal to use alane as the source of Al. It should be noted that alane is free from C or O that may cause the undesirable contamination of the crystal layer. On the other hand, alane is a chemically unstable compound and easily causes a gaseous reaction when contacted with TMG, TEG or TMI. Thus, there has been a difficulty to use alane to grow a layer that forms a mixed crystal.

By using the amine adduct of alane represented as $AlH_3.NR$; $R=(CH_3)_3$, $(CH_3)_2.C_2H_5$, . . . as the source material, the chemical stability of the source material increases as a result of the effect of the adduct, and one can suppress the unwanted gaseous reaction from occurring even when the gaseous source material of Al is used in combination with the compounds such as TMGDEA, TEGDEA or TMIDEA. Thereby, a layer of mixed crystal containing Al is obtained on the surface of the substrate. The forgoing process that uses the amine-adduct of alane is particularly useful when growing a mixed crystal layer of Ga and Al on a substrate by the ordinary MBE or MOCVD process wherein different source gases are supplied simultaneously.

In the foregoing embodiments for growing a group III-V semiconductor layer, the source material of the group III element is by no means limited to the amine-adduct compounds described before, but the amine-adduct of other compounds may also be used. These compounds include $(CH_3)_3Al$, $(CH_3)_3Ga$, $(CH_3)_3In$, $(C_2H_5)_2Al$, $(C_2H_5)_2Ga$, and $(C_2H_5)_2In$.

The growth of the semiconductor layer from the amine-adduct of alkyl compound according to the present invention is useful also when conducting atomic layer epitaxy of group II-VI compounds. In this case, one can use the amine adduct of the compounds such as $(CH_3)_2Hg$, $(CH_3)_2Cd$, $(CH_3)_2Zn$, $(CH_3)_2Be$, $(C_3H_7)_2Be$, $(CH_3)_2Mg$, $(C_2H_5)_2Hg$, $(C_2H_5)_2Cd$, $(C_2H_5)_2Zn$, $(C_2H_5)_2Be$, $(C_4H_9)_2Be$ as the source material of the group II elements. Further, one may use the amine adduct of alkyl compounds also for the gaseous source material of the group VI elements. For example, one may use the amine adduct of the group VI compounds such as $(CH_3)_2Se$, $(CH_3)_2Te$, $(C_2H_5)_2Se$ and $(C_2H_5)_2Te$ for this purpose.

The amine-adduct is also useful as the source material of the group V and IV elements. As the gaseous source material of the group V elements, the amine-adducts of the compounds such as $(CH_3)_3As$, $(CH_3)_3P$, $(CH_3)_3Sb$, $(C_2H_5)_3As$, $(C_2H_5)_3P$, $(C_2H_5)_3Sb$, $(C_2H_5)_3AsH_2$, $(C_2H_5)_3PH_2$, $(C_3H_7)_3Sb$, $(C_4H_9)AsH_2$, $(C_4H_9)PH_2$, $(C_4H_9)SbH_2$, and $(C_4H_9)(CH_3)Sb$ may be used. Further, as the gaseous source material of the group IV elements, the amine-adducts of the compounds such as $(CH_3)_4Si$, $(CH_3)_4Ge$, $(CH_3)_4Pb$, $(CH_3)_4Sn$, $(C_3H_7)_4Sn$, $(C_2H_5)_4Si$, $(C_2H_5)_4Ge$, $(C_2H_5)_4Pb$, $(C_2H_5)_4Sn$, and $(C_4H_9)_4Sn$ may be used. In the foregoing compounds, alkylamine compounds such as $N(CH_3)_3$ or $N(CH_3)_2(C_2H_5)$ may be used as the amine adduct.

Generally, the present invention used an amine adduct of alkyl compound that is generally represented as $MR_1.NR_2$ as the source material of the compound semiconductor layer, wherein M represents the constituent element of the compound semiconductor material, $R_1$ represents hydrogen or an alkyl group, and $R_2$ represents an alkyl compound represented as

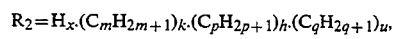

in which x, k, h and u are integers that satisfy a relationship $x+k+h+u=3$.

According to the present invention, the source material of the compound semiconductor material is stabilized chemically by adding an amine-adduct. As a result of such a stabilization of the source material, the optimum range for conducting the atomic layer epitaxy is expanded significantly, and an atomic layer epitaxy of a mixed crystal layer that contains two or more elements becomes possible. It should be noted that such an atomic layer epitaxy of mixed crystals has been hitherto impossible because of the different optimum temperatures of various elements. Further, because of the increased stability of the source material, the source material of the present invention does not cause spontaneous ignition even when contacted with air. Thereby, the handling of the source material is significantly simplified and the fabrication cost of the semiconductor device is decreased. Further, as a result of the increased stability of the source materials, the problem of unwanted chemical reaction between the gaseous source materials is suppressed effectively even when the source material is used together with a reactive compound such as alane. Thereby, the degree of freedom for choosing the composition of the mixed crystal increases significantly.

Further, the present invention is not limited to the embodiments described heretofore, but various variations and modifications may be made without departing from the scope of the present invention.

What is claimed is:

1. A method for fabricating a semiconductor device that includes a crystal layer of a compound semiconductor material, said crystal layer containing a plurality of constituent elements, comprising the steps of:
   (a) supplying an amine-adduct of a first compound that contains a first constituent element of said crystal layer, to a substrate on which said semiconductor device is to be formed, as a first source material of said crystal layer;
   (b) decomposing said amine-adduct in the vicinity of said substrate such that said first constituent element of said crystal layer is released from said amine-adduct;
   (c) depositing said first constituent element of said crystal layer, released by said step (b) of decomposing, on said substrate to cause a growth of said crystal layer on said substrate;
   (d) supplying a second compound that contains a second constituent element of said crystal layer, to said substrate as a second source material of said crystal layer;
   (e) decomposing said second compound in the vicinity of said substrate such that said second constituent element of said crystal layer is released from said second compound;
   (f) depositing said second constituent element of said crystal layer, released by said step (e), on said substrate to cause a growth of said crystal layer on said substrate;
   said steps (a) through (c) forming a first process, said steps (d) through (f) forming a second process, wherein said first and second process are carried out repeatedly and alternately with intervening flushing steps.

2. A method as claimed in claim 1, wherein said method further comprises the steps of:
   (g) supplying a third compound that contains a third constituent element of said crystal layer, to said substrate as a third source material of said crystal layer;
   (h) decomposing said third compound in the vicinity of said substrate such that said third constituent element of said crystal layer is released from said third compound;
   (i) depositing said third constituent element of said crystal layer, released by said step (h), on said substrate to cause a growth of said crystal layer on said substrate;
   said steps (g) through (i) forming a third process, wherein said first process, said second process and said third process are carried out sequentially and repeatedly, with flushing steps interposed between said step (c) and said step (d), said step (f) and said step (g), and said step (i) and said step (a).

3. A method as claimed in claim 2, wherein said first and third constituent element comprises a group III element and said second constituent element comprises a group V element.

4. A method as claimed in claim 2, wherein at least one of said second and third compounds is supplied in the form of amine-adduct.

5. A method as claimed in claim 1, wherein said step (c) for depositing said first constituent element on said substrate and said step (f) for depositing said second constituent element on said substrate are carried out at the same temperature of said substrate.

6. A method as claimed in claim 1, wherein said amine-adduct of said first compound comprises dimethylethylamine.

7. A method as claimed in claim 1, wherein said first constituent element comprises a group III element.

8. A method as claimed in claim 7, wherein said first constituent element comprises Ga.

9. A method as claimed in claim 7, wherein said first constituent element comprises In.

10. A method as claimed in claim 7, wherein said first constituent element comprises Al.

11. A method as claimed in claim 1, wherein said first source material is an amine-adduct of the compound selected from a group consisting of triethylgallium, trimethylindium, and alane.

12. A method as claimed in claim 1, wherein said first constituent element comprises a group II element, and said first source material is an amine-adduct of the compound selected from a group consisting of $(CH_3)_2Hg$, $(CH_3)_2Cd$, $(CH_3)_2Zn$, $(CH_3)_2Be$, $(C_3H_7)_2Be$, $(CH_3)_2Mg$, $(C_2H_5)_2Hg$, $(C_2H_5)_2Cd$, $(C_2H_5)_2Zn$, $(C_2H_5)_2Be$, and $(C_4H_9)_2Be$.

13. A method as claimed in claim 1, wherein said first constituent element comprises a group III element, and said first source material is an amine-adduct of the compound selected from a group consisting of $(CH_3)_3Al$, $(CH_3)_3Ga$, $(CH_3)_3In$, $(C_2H_5)_2Al$, $(C_2H_5)_2Ga$, and $(C_2H_5)_2In$.

14. A method as claimed in claim 1, wherein said first constituent element comprises a group IV element, and said first source material is an amine-adduct of the compound selected from a group consisting of $(CH_3)_4Si$, $(CH_3)_4Ge$, $(CH_3)_4Pb$, $(CH_3)_4Sn$, $(C_3H_7)_4Sn$, $(C_2H_5)_4Si$, $(C_2H_5)_4Ge$, $(C_2H_5)_4Pb$, $(C_2H_5)_4Sn$, and $(C_4H_9)_4Sn$.

15. A method as claimed in claim 1, wherein said first constituent element comprises a group V element, and said first source material is an amine-adduct of the compound selected from a group consisting of $(CH_3)_3As$, $(CH_3)_3P$, $(CH_3)_3Sb$, $(C_2H_5)_3As$, $(C_2H_5)_3P$, $(C_2H_5)_3Sb$, $(C_2H_5)_3AsH_2$, $(C_2H_5)_3PH_2$, $(C_3H_7)_3Sb$, $(C_4H_9)AsH_2$, $(C_4H_9)PH_2$, $(C_4H_9)SbH_2$, and $(C_4H_9)(CH_3)Sb$.

16. A method as claimed in claim 1, wherein said first constituent element comprises a group VI element, and said first source material is an amine-adduct of the compound selected from a group consisting of $(CH_3)_2Se$, $(CH_3)_2Te$, $(C_2H_5)_2Se$ and $(C_2H_5)_2Te$.

17. A method for fabricating a semiconductor device that includes a crystal layer of a compound semiconductor material, comprising the steps of:

(a) supplying an amine-adduct of an alkyl compound that contains a constituent element of said crystal layer, to a substrate on which said semiconductor device is formed, as a source material of said crystal layer;

(b) decomposing said amine-adduct in the vicinity of said substrate such that said constituent element of said crystal layer is released from said amine-adduct; and (c) depositing said constituent element of said crystal layer, released by said step (b) of decomposing, on said substrate to cause a growth of said crystal layer on said substrate.

* * * * *